(12) United States Patent
Moers

(10) Patent No.: US 6,711,390 B1
(45) Date of Patent: Mar. 23, 2004

(54) PROGRAM RELATED DATA IN AN FM RDS RECEIVER

(75) Inventor: Paulus Louis Guido Moers, Eindhoven (NL)

(73) Assignee: Siemens VDO Automotive AG, Frankfurt (DE)

(*) Notice: Subject to any disclaimer, the term of this patent is extended or adjusted under 35 U.S.C. 154(b) by 0 days.

(21) Appl. No.: 09/673,904

(22) PCT Filed: Feb. 11, 2000

(86) PCT No.: PCT/EP00/01120
§ 371 (c)(1),
(2), (4) Date: Dec. 8, 2000

(87) PCT Pub. No.: WO00/51235
PCT Pub. Date: Aug. 31, 2000

(30) Foreign Application Priority Data
Feb. 11, 2000 (EP) .................................. 99200527

(51) Int. Cl.[7] .................................................. H04B 1/18
(52) U.S. Cl. .................. 455/186.1; 455/45; 455/186.2; 455/180.4; 455/226.1; 455/226.2; 455/161.3; 455/161.2; 455/73
(58) Field of Search .................. 455/73, 45, 180.2, 455/180.4, 188.2, 186.1, 186.2, 161.1, 161.2, 161.3, 184.1, 226.1, 226.2

(56) References Cited

U.S. PATENT DOCUMENTS

| 5,220,682 A | * | 6/1993 | Tomohiro ................. 455/161.2 |
| 5,345,602 A | | 9/1994 | Wiedemann et al. ........ 455/137 |
| 5,390,343 A | * | 2/1995 | Rupprecht et al. ........ 455/161.3 |
| 5,428,825 A | * | 6/1995 | Tomohiro et al. ......... 455/186.1 |
| 5,428,827 A | * | 6/1995 | Kasser .................... 455/161.3 |
| 5,535,442 A | * | 7/1996 | Kishi ...................... 455/184.1 |
| 5,548,828 A | * | 8/1996 | Kozaki et al. ............ 455/161.2 |
| 5,584,051 A | * | 12/1996 | Goken ....................... 455/68 |
| 5,802,066 A | * | 9/1998 | Miyake et al. .............. 370/527 |
| 5,815,170 A | * | 9/1998 | Kimura et al. ........... 455/186.1 |
| 6,038,434 A | * | 3/2000 | Miyake ................... 455/186.1 |
| 6,141,536 A | * | 10/2000 | Cvetkovic et al. ............ 455/45 |
| 6,240,280 B1 | * | 5/2001 | Ravi et al. ................ 455/161.1 |
| 6,282,412 B1 | * | 8/2001 | Lyons ..................... 455/186.1 |

FOREIGN PATENT DOCUMENTS

| EP | 0333194 | 9/1989 | ............. H03J/7/18 |
| EP | 0459360 | 12/1991 | ............. H04H/1/00 |

* cited by examiner

Primary Examiner—Vivian Chin
Assistant Examiner—Marceau Milord
(74) Attorney, Agent, or Firm—Mayer, Brown, Rowe & Maw LLP.

(57) ABSTRACT

Method for processing transmitter and program related data in an FM RDS receiver and receiver executing the method, providing a band scanning search for detecting FM RDS transmitters exceeding a predetermined reception quality level. To enhance efficiency in data processing and use of storage capacity, transmitter related data including tuning data is stored separately from program related RDS data. Per each detected transmitter a quality factor indicating the quality in reception quality thereof is being allocated to each detected RDS transmitter and stored in a first memory bank, along with the relevant tuning data. Per each program identification code carried in the RDS data of the so detected transmitters program related FM RDS data are being stored in a second memorybank, a linkage code defining the storage address within the second memory bank containing the program data carried by the relevant FM RDS transmitter being allocated to the transmitter data of each FM RDS transmitter and stored in the first memory bank.

6 Claims, 4 Drawing Sheets

PROGRAM RELATED DATA IN AN FM RDS RECEIVER

BACKGROUND OF THE INVENTION

1. Field of the Invention

The present invention relates generally to the field of telecommunications devices. More specifically, the present invention is directed to a method for processing transmitter and program related data in an FM RDS receiver and to a receiver for executing the method.

2. Description of the Related Art

The invention relates to a method for processing transmitter and program related data in an FM RDS receiver and to a receiver executing the method.

The FM RDS broadcasting standard is defined in 'Specification of the Radio Data System FM RDS for VHF-FM Sound Broadcasting' by the European Broadcasting Union (EBU), EBU document Tech 3244-E, March 1984 and updated in subsequent revisions thereof. Reference is made to this document for a correct understanding of the meaning and definition of the various terms and abbreviations used hereinafter in connection with the FM RDS standard.

An FM RDS receiver executing the above method is on itself known e.g. from European Patent 0 333 194. The known FM receiver is a dual tuner FM RDS receiver having a first or main tuner and a second or auxiliary tuner. The main tuner is used to tune the receiver to a broadcast transmitter station with a wanted audio program and to process the audio program signals for sound reproduction. If the transmitter transmits RDS data as well, then the main tuner will also extract the RDS data carried by the received RDS transmitter signal, in particular a list of alternative frequencies (AFs). Such list provide tuning data of transmitter frequencies carrying the same program as the one the receiver is actually tuned to. The auxiliary tuner is used to monitor the reception quality of the transmitter signals at each of those AFs. For this, the auxiliary tuner is sequentially switched to each AF in the AF list to measure the reception quality of the transmitter signals at the respective AFs. This reception quality information is stored in a memory and continuously updated in sequential scan cycles. On deterioration of the received transmitter signal the main tuner is automatically switched over in its tuning to the AF stored in the memory having highest reception quality.

The options in the above automatic switch-over of the tuning of the main tuner are limited to the correctly received and decoded AFs.

It is an object of the invention to remove this limitation and to increase the range of tuning selection options.

SUMMARY OF THE INVENTION

According to the invention a method for processing transmitter and program related data in an FM RDS receiver is therefore characterized by a band scanning search for detecting FM RDS transmitters exceeding a predetermined reception quality level, by storing in a first memory bank transmitter related data per each such transmitter, including the tuning data and a quality factor indicating the quality in reception thereof, by storing in a second memory bank program related FM RDS data per each received program identification code and by allocating to the transmitter data of each FM RDS transmitter stored in the first memory bank a linkage code defining the storage address within the second memory bank containing the program data carried by the relevant FM RDS transmitter.

By the measure according to the invention no use is made of FM RDS AF data. Instead, the second tuner is used to scan sequentially through the frequency band to search for any broadcasting transmitter station received with adequate RF signal reception quality, including FM RDS broadcast stations. Upon detection of such FM broadcasting transmitter station, the scanning is stopped to read the above transmitter related data into the first memory bank and in case of an FM RDS signal to read the FM RDS data into the second memory bank as well. The splitting in the storage of the transmitter related data and the program related data allows to make efficient use of storage capacity while preserving any tuning selection option for the user as will hereinafter be explained in more detail. The storage of RDS program data allows e.g. to provide AF switching without making use of the AF lists included in the RDS data and/or to extend the definition of alternative programs from strictly identical audio programs to non-identical programs within a certain RDS program category, such as PTY.

An FM RDS receiver executing the method according to the invention comprising first and second tuner circuits for receiving and processing respectively audio signals and FM RDS data, comprising tuning control means to vary the tuning frequency of the second tuner circuit over a frequency band to detect FM RDS transmitters received with a reception quality exceeding a predetermined quality threshold level, the first tuner circuit automatically switching over in its tuning from an actually received first FM RDS transmitter to a second FM RDS transmitter detected by the second tuner circuit when the reception quality of the first FM RDS transmitter decreases below a predetermined level characterized by a processing unit storing in a first memory bank per each selected FM RDS transmitter, transmitter related data including the tuning data and a quality factor indicating the reception quality thereof and in a second memory bank program related FM RDS data per each received program identification code and by allocating to the transmitter data of each FM RDS transmitter stored in the first memory bank a linkage code defining the storage address within the second memory bank containing the program data carried by the relevant FM RDS transmitter.

Preferably, the method is characterized in that the band scanning search is being repeated in subsequent scan cycles, the transmitter related data being updated with regard to its quality factor and being deleted from the first memory bank when the quality factor decreases below a predetermined quality threshold level.

An FM RDS receiver executing said preferred method is characterized in that the tuning control means controls the tuning of the second tuning circuit to repeat the band scanning search in subsequent scan cycles to update the quality factor of each detected transmitter, the storage locations in the first memory bank relating to transmitters decreasing in quality factor below a predetermined quality threshold level, being deleted.

This measure further improves the efficiency in the use of memory capacity without losing the information which transmitter frequency should be chosen in case the actually received transmitter signal decreases below said predetermined threshold level.

A further preferred method is characterized by an automatic tuning switch over from a first FM RDS transmitter to a second FM RDS transmitter, when the first FM RDS transmitter signal decreases below a predetermined threshold field strength level, the second FM RDS transmitter being selected from the FM RDS transmitters in the first memory bank having the same linkage code as the first FM RDS transmitter.

An embodiment of an FM RDS receiver executing the last mentioned further preferred method is characterized in that in selecting the second transmitter the processing unit is limited to FM RDS transmitters having the same linkage code as the first FM RDS transmitter signal.

By this measure the alternative frequencies (AFs), i.e. the transmitter frequencies carrying the same audio program as the one the first tuner circuit is actually tuned to, are not derived from the AF list included in the FM RDS data, but from those transmitter having the same linkage code attached thereto. The AF having highest reliability in reception quality, i.e. highest quality factor and/or field strength, can be determined very quickly.

These and further aspects and advantages of the invention will be discussed in more detail hereinafter with reference to the disclosure of preferred embodiments, and in particular with reference to the appended Figures that show:

DETAILED DESCRIPTION OF THE PRESENTLY PREFFERED EMBODIMENTS

Figure 1:
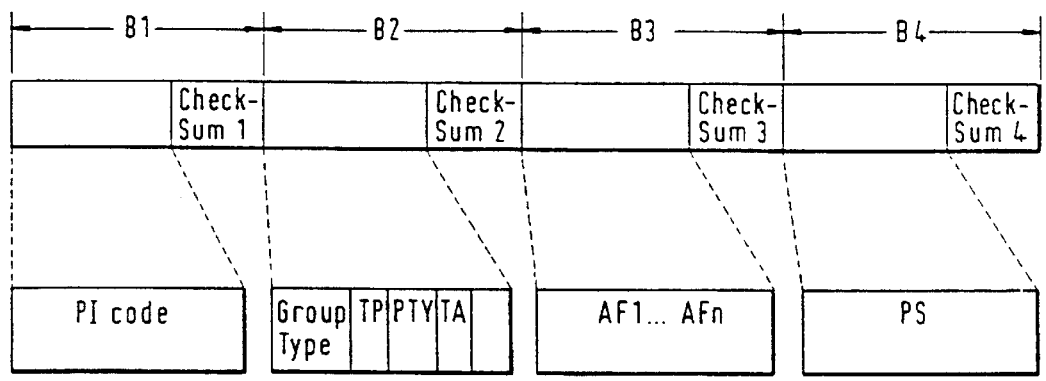
FIG. 1 an FM RDS base and coding structure.

FIG. 1 shows the FM RDS baseband coding structure in the data format of the FM RDS Group type 0A as more specifically defined in the abovementioned EBU document. The 0A Group type is to provide basic tuning and switching information and like other Group types consists of four blocks B1–B4, each containing a 16 bit information carrying part and a 10 bits checkword and offset part, respectively C1–C4. The checkword and offset parts C1–C4 provide error protection and block and group synchronization information. In the 0A Group type, the information carrying parts of blocks B1–B4 respectively comprise:

In block 1: a Program Identification (PI) code;

In block 2: a.o. a Group type code, a Traffic Program Identification (TP) code, a Traffic Announcement (TA) code, a Program Type (PTY) code;

In block 3: alternative frequency (AF) codes;

In block 4: a Program Service (PS) name segment.

The FM RDS standard provides for a Group type 0B, which differs from the Group type 0A in that in block 3 the PI code is repeated.

For detailed information on the specifics of these FM RDS items, reference is made to the abovementioned EBU document.

Figure 2:
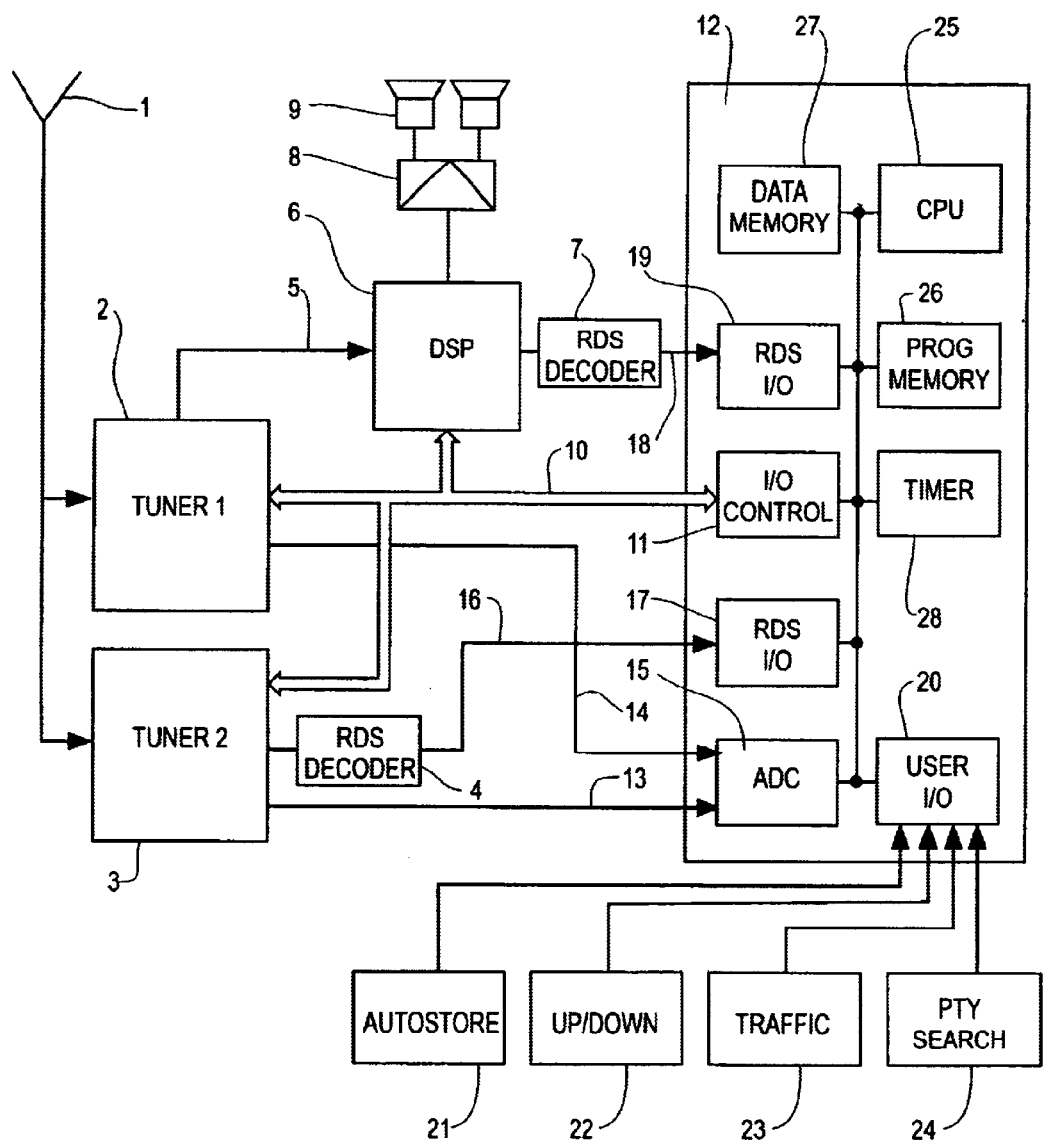
FIG. 2 a block diagram of a dual tuner FM RDS receiver according to the invention.

FIG. 2 shows a block diagram of an FM RDS receiver according to the invention, which coupled to an antenna 1 comprises first and second tuner circuits 2 and 3 for processing respectively audio signals and FM RDS data. The tuning frequency of both first and second tuner circuits 2 and 3 are controlled through tuning control means 10, 11, 25 including a central processing unit (CPU) 25 and an I/O control module 11 of a microprocessor 12 and a control bus 10. By manual operation of one of keys 21–24 the tuning frequency of the first tuner circuit 2 can be set through a user interface I/O module 20 to the transmitter frequency ft of a wanted FM broadcast station. Key 21 is to activate an autostore functionality, key 22 is to activate an up/down search, key 23 is to switch on/off the reception of traffic messages and key 24 is to activate a search for programs within the same PTY category as the one actually received. These functionalities require the use of a program memory 26 for the storage of program software and a timer module 28 and are on themselves already known from the prior art FM RDS receiver cited hereinafter. The first tuner circuit 2 provides for the selection and demodulation of a wanted RF FM broadcast signal into baseband and comprises means (not shown) to measure the reception quality of the received FM RF signal. A quality factor reflecting said reception quality is supplied via a quality level line 14 to an AD converter module 15 of the microprocessor 12 to be further processed as described hereinafter.

Dependent on the content of the received FM broadcast signals, the baseband signal may comprise an RDS signal and/or a mono or stereomultiplex signal. The baseband signal is supplied via a signal line 5 from an output of the first tuner circuit 2 to a digital signal processor 6. The digital signal processor 6 comprises audio signal processing means (not shown) to process mono audio signals and eventually to demultiplex stereomultiplex signals into stereo left and right audio signals and is coupled to an audio amplifier 8 and loudspeaker set 9 for reproduction of the so derived audiosignals.

The digital signal processor 6 is coupled to an RDS decoder 7 to decode RDS data contained in the received FM broadcast signal. The decoded RDS data is supplied via an RDS data line 18 to an RDS data I/O module 19 of the microprocessor 12. RDS data processing occurs under control of the CPU 25 of the microprocessor 12.

The second tuner circuit 3 is used to select and demodulate RDS signals from an RF FM broadcast signal and is therefore also indicated as data tuner. An RDS decoder 4 following the output of the second tuner circuit 3 derives RDS data from the demodulated RDS signal. The RDS data is supplied via an RDS data line 16 to an RDS data I/O module 17 of the microprocessor 12. Apart therefrom, the second tuner 3 also comprises means (not shown) to measure the reception quality of the received RF FM broadcast signal. A quality factor reflecting said reception quality is supplied via a quality level line 13 to the AD converter module 15 of the microprocessor 12 for an adequate processing and storage thereof.

The tuning frequency of the second tuner circuit 3 is automatically varied to scan over the RF FM broadcast reception band ranging from 87.5 MHz to 108 MHz. Upon first reception of an FM broadcast station fx having a reception quality exceeding a certain predetermined threshold level qt, the scanning is stopped to make measurement and storage operations under control of the CPU 25, as described in the following with reference to FIG. 3:

1. the tuning data of fx is stored at a storage address Tx of a first memory bank Ml, included in a data memory 27 of the microprocessor 12;
2. the reception quality of fx is measured and a quality factor derived therefrom is stored at Tx;

if RDS signals are being received, then in addition thereto:

3. a linkage code is allocated to fx at Tx in the first memory bank M1, this linkage code referring to the storage address Ny of a second memory bank M2 included in the data memory 27;

4. the PI code of the RDS signals carried by fx, as well as the PTY-, TA-, TMC-, PS-, and/or PS Mask codes are stored in the second memory bank M2 at Ny.

The data stored in the first memory bank M1 are typically transmitter related and together form a list in a transmitter structure, hereinafter also indicated as transmitter list. The data stored in the second memory bank tit M2 are typically program or network related and together form a list in a PI-structure, hereinafter also indicated as program data or network list.

Parameters for the quality factor may include field strength, but also (lack of) multipath and other enviromental sources of pollution and the above predetermined threshold level is chosen such, that RF FM broadcast signals exceeding this level can be processed properly without giving rise to receiver malfunctioning and/or noticeable signal distortions. In the FM RDS receiver of FIG. 2 the quality factor is derived from the field strength of the RF reception signal, for fx being indicated with sx.

If in a subsequent scan cycle fx is not detected anymore, then all data in the first memory bank M1 related to fx will be removed, because the quality factor sx has decreased below a quality threshold level st. If the linkage code ly of fx is not shared by other transmitters then also the RDS data will be removed from the second memory bank M2. The removal of data from the first and second memory banks M1 and M2 may be effected by deletion thereof or by releasing the relevant storage locations for the storage of new data, so that the obsolete data will be overwritten.

The storage of transmitter related data in the first memory bank M1 separated from the storage of program or network related data in the second memory bank M2 allows for an efficient use of memory capacity, because transmitters carrying the same PI code share the same storage address in M2. Per each different PI=code, all related other RDS codes, such as e.g. PTY-, TA-, TMC-codes, are stored only once. Furthermore, said separation in storage also allows for efficient data processing, in particular for the purpose of an AF search, i.e. finding an alternative frequency carrying the same RDS program as the one the first tuner circuit 2 is actually tuned to. As all data needed for the AF search is already available in the first memory bank M1, the second memory bank M2 can be excluded from the AF search operation. For instance, the AF functionality requires that the AF having highest reception quality (fh) should be known any time in order to be able to automatically switch over the tuning of the first tuner circuit 2 from an RDS transmitter ft, the first tuner circuit 2 is actually tuned, to said fh, when the reception quality of ft decreases below the above predetermined threshold quality level st. This means that the quality factor of transmitters carrying the same program as the RDS transmitter ft, the first tuner circuit 2 is actually tuned, should be continuously monitored. According to the invention this monitoring is limited to transmitters having the same linkage code as the RDS transmitter ft. The use of linkage codes in searching AFs in accordance with the invention removes the necessity to decode and store the AF data transmitted in block 3 of the above RDS Group type 0A.

As all transmitter related data are all stored in the first memory bank M1, the tuning selection options based on reception quality are all preserved. For instance, by activating the 'autostore' option with key 21, the quality factors of the various transmitters stored in the first memory bank M1 may be compared with a certain threshold level, chosen such that it is exceeded by e.g. 6 transmitters, which can be RDS- or non-RDS transmitters. The tuning data of these transmitters are to be stored under the autostore feature and called upon by operating the key 21. As a criterium for this threshold level the quality factor s may be used. This is also applies to the determination of a threshold level for use in the up/down search of transmitters, which can be activated with key 22.

As program related data connected to the PI-code of the received RDS signals are stored in the second memory bank M2, the tuning selection options based on these RDS data are all preserved too. For instance, the availability of PTY-codes allows to make a conventional search for PTY transmitters, which can be activated with key 24.

The receiver can also be set to reproduce traffic messages by an operation of key 23. For the criterium to select an appropriate traffic message transmitting RDS broadcast station amongst those carrying the traffic announcement flag, preferably field strength is used. The transmitter received strongest (i.e. with highest field strength) is in practise nearest to the receiver location and the traffic messages of that transmitter are therewith most relevant to the user.

Figure 3:
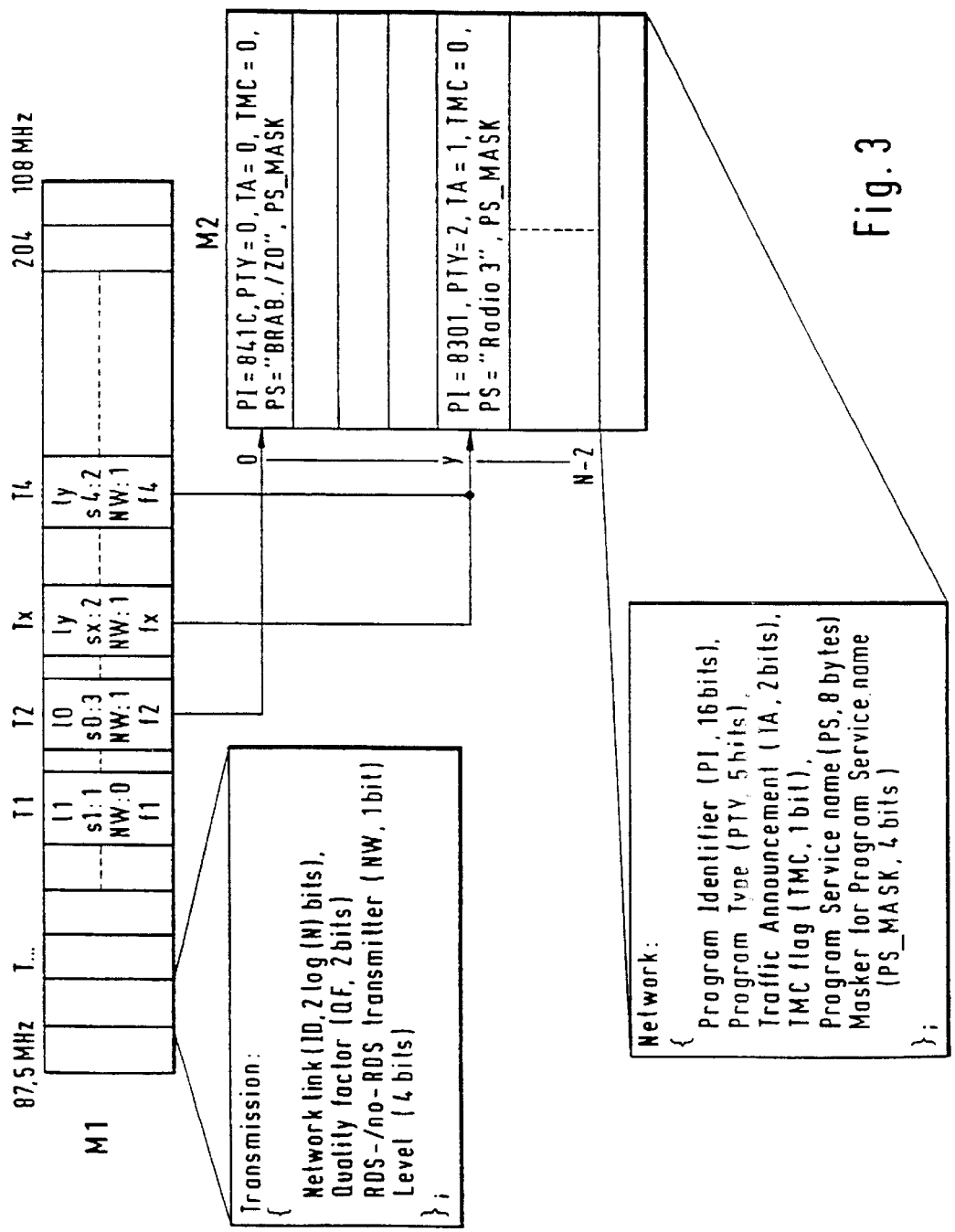
FIG. 3 a functional scheme of the list structure provided by the first and second memories as used in the FM RDS receiver of FIG. 2.
Figure 4:
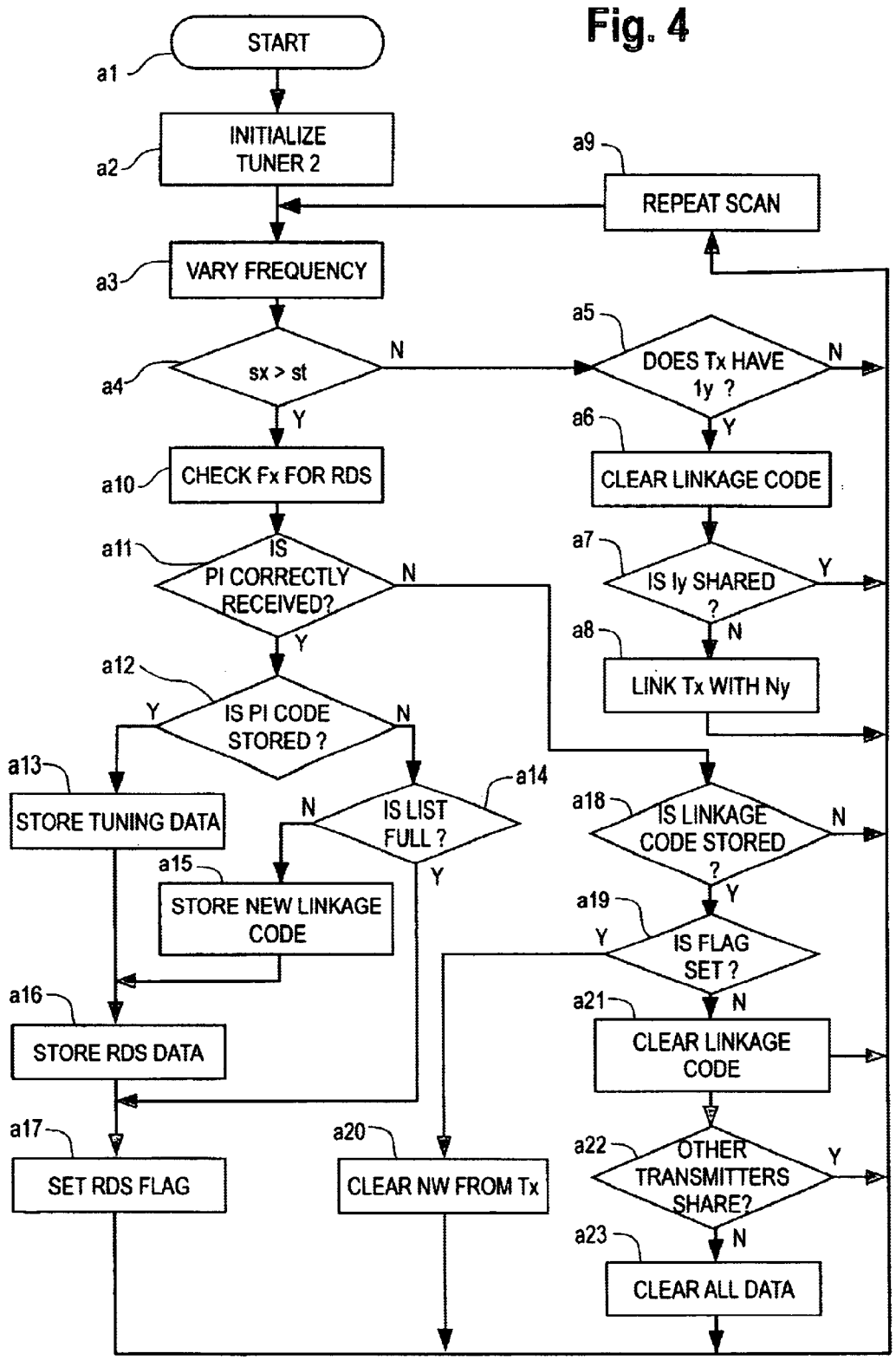
FIG. 4 a flowchart illustrating the method according to the invention as being executed by the FM RDS receiver of FIG. 2.

FIG. 4 shows a flowchart of an algorithm implementing a method for tuning the reception of radio broadcast signals to an FM RDS transmitter using program related data and transmitter related data in accordance with the invention, in which references are made to FIG. 3. Steps a1–a30 of this flowchart have the following meaning:

a1 When the radio is turned on, the algorithm starts.

a2 The second tuner circuit 3 is initialised for a first search scan starting at the lowest transmitter frequency in the FM band (87.5 MHz).

The first and second memory banks M1 and M2 are being initialised for storage of respectively transmitter related data and RDS program data in transmitter (T) and program or network (N) lists.

a3 The tuning frequency of the second tuner circuit 3 is varied until a transmitter fx is received. The scanning procedure is interrupted to measure the field strength and to allocate and store a factor sx reflecting the field strength in the T list of the first memory bank M1 at storage address Tx.

a4 Does sx exceed a predetermined threshold level st (e.g. st=1)? If so, then go to a10. Otherwise go to a5.

a5 The field strength level (sx) is not good enough. Tx is checked on the presence of certain data, which could have been allocated to fx in a previous scan cycle. If fx has previously appeared as an RDS transmitter, then Tx would contain a linkage code. Such linkage code, e.g. ly, refers to a N list storage address Ny in the second memory bank M2, whereat the RDS data attached to the PI-code carried by the RDS transmitter fx is stored. Does Tx contain such linkage code ly? If so, go to a6. If not, then fx has not been recognized previously as an RDS transmitter: go to a9.

a6 Clear this linkage code as well as an eventual RDS flag from Tx.

a7 It is possible that more transmitters are linked via the same linkage code ly to the same Ny address storage location of the N list of the second memory bank M2. Is ly shared by more transmitters? If so, then go to a9. Otherwise go to a8.

a8 Tx of the first memory bank M1 is one-to-one linked through ly with Ny of the second memory bank M2: clear also Ny.

a9 Resume the scanning operation. When the upper end of the FM band (at 108 MHz) is reached, repeat the scan cycle starting again (a3) from the lowest transmitter frequency (87,5 MHz).

a10 The fieldstrength factor sx of fx is OK. Wait some time to check fx carries RDS data and if so, to collect the same.

all Check whether the Program Identification (PI-) code, or Program Identifier PIy included in the RDS data of fx is correctly received. If so, go to a12, otherwise go to a18.

a12 Check whether the same PI-code PIy has been received and stored in the N list of the second memory bank M2, previously. If so, go to a13, otherwise go to a14.

a13 Store at the storage location Tx of the fx tuning data in the T list of the first memory bank M1, the linkage code ly defining the storage address Ny of PIy in the N list of the second memory M2.

a14 The received PI-code is new, e.g. PIz: the N list in M2 is scanned to check whether the N list is fully occupied. If so, go to a17, otherwise go to a15.

a15 In the N list free storage capacity appears to be available at e.g. storage address Nz. A new linkage code lz linking Tx of M1 to Nz of M2 is defined and allocated to fx. This new linkage code lz is stored at the storage location Tx of the fx tuning data in the T list of the first memory bank M1.

a16 Store all received RDS data carried by RDS transmitter fx in Ny, or Nz as the case may be.

a17 To indicate, without having a linkage code, that fx is an RDS transmitter an RDS flag NW at Tx is being set.

a18 No PI code is received. Check whether at the storage location Tx of the fx tuning data in the first memory bank M1 a linkage code is stored. If so, go to a19. If not, then fx is a non-RDS-transmitter: go to a9.

a19 A linkage code is available, so fx is an RDS transmitter. Check whether an RDS flag NW is set at the storage location Tx of the fx tuning data in the first memory bank M1. If so, go to a20, otherwise go to a 21.

a20 NW is set: clear NW from the storage location Tx of the fx tuning data in the first memory bank M1, but maintain the linkage code.

a21 NW has been cleared already, clear the linkage code.

a22 Do other transmitters in M1 share the same linkage code? If so go to a9, otherwise go to a23.

a23 Clear all data from the memory location at storage address of the second memory bank M2 (Ny or Nz as the case may be), which was linked by the linkage code to Tx.

The method applied in the above algorithm uses the RDS flag NW to keep the storage of RDS data in the second memory bank M2 carried by a detected RDS transmitter on hold, until storage capacity in M2 becomes available. The RDS flag NW can be dispensed with, if M2 provides sufficient storage capacity to store all receivable PI codes.

For an understanding of the invention no knowledge is needed about the practical implementation of the various circuitry and functions mentioned in the above in connection therewith, such as e.g. the tuning control means providing repetitions of search scan cycles, the measurement of the reception quality and the derivation of a quality factor therefrom, the selection/detection of adequately receivable transmitters, the extraction of various categories RDS data from the received RDS signals, the storage of the transmitter and program related data in M1 and M2, the switching in the tuning of the first tuner circuit 2 to an alternative frequency, etc., etc. For further details in this respect, reference is made to the FM RDS radio receiver type VDO RC 959 RDS.

Furthermore, the invention may well be applied while excluding any historical influence from the determination of the quality factor e.g. by using the momentary value of the reception quality as a basis for the quality factor.

The invention requires the first and second memory banks M1 and M2 to be organized to function as separate storage means, allowing M1 and M2 to be physically comprised in one memory or spread over several storage devices, dependent on the programming of the CPU 25.

What is claimed is:

1. A method for processing transmitter and program related data in an FM RDS receiver comprising the steps of:

scanning a frequency band to detect FM RDS transmitters that exceed a threshold level;

receiving signals from a first detected FM RDS transmitter that exceeds the threshold level and reading transmitter data and program related FM RDS data including a unique program identification code;

storing transmitter data for each transmitter that exceeds the threshold level, wherein the transmitter data includes tuning data and a quality factor indicating a reception quality of the transmitter;

storing program related FM RDS data for received transmitter data from the first detected FM RDS transmitter and allocating a linkage code to the transmitter data for the first detected FM RDS transmitter, wherein the linkage code defines a memory location for program data carried by the first FM RDS transmitter; and wherein program related FM RDS data including a program identification code is read from a second detected FM RDS transmitter and the program related FM RDS data from the second detected FM RDS is compared with the stored program related FM RDS data and if the program related FM RDS data from the second detected FM RDS transmitter is identical to the stored program related RDS data, allocating the linkage code defining memory locations for program data carried by the first FM RDS transmitter to the transmitter data from the second detected FM RDS transmitter.

2. The method according to claim 1, wherein the step of performing the scanning search is repeated in subsequent scan cycles and the transmitter related data is updated as to a quality factor and transmitters are deleted when the quality factor decreases below a threshold.

3. The method according to claim 2, further comprising a step of switching from a first FM RDS transmitter to a second FM RDS transmitter when the first FM RDS transmitter signal decreases below a threshold level.

4. An FM RDS receiver comprising:

first and second tuner circuits for receiving audio signals and FM RDS data;

a tuning control means which varies a tuning frequency of the second tuner circuit over a frequency band to detect FM RDS transmitters that exceed a threshold level;

wherein the first tuner circuit automatically switches from tuning to a received first FM RDS transmitter to a second FM RDS transmitter when a reception quality of the first FM RDS transmitter falls below a threshold level; and a means for storing a quality factor associated with the received first FM RDS signal wherein a linkage code defines a storage location for program related FM RDS data including a unique program identification code associated with the received first FM RDS transmitter; and wherein program related FM RDS data including a program identification code is read from a second detected FM RDS transmitter and the program related FM RDS data from the second detected FM RDS is compared with the stored program related FM RDS data and if the program related FM RDS data from the second detected FM RDS transmitter is identical to the stored program related RDS data, allocating the linkage code defining memory locations for program data carried by the first FM RDS transmitter to the transmitter data from the second detected FM RDS transmitter and storing a quality factor associated with the received second FM RDS signal.

5. An FM RDS receiver according to claim 4, wherein the tuning control means controls the tuning of the second tuning circuit to repeat a band scanning search in subsequent scan cycles to update a quality factor of each detected transmitter and wherein.

6. An FM RDS receiver according to claim 5, wherein a processing unit limits a selection of FM RDS transmitters which have a similar linkage code.

* * * * *